(12) United States Patent
Lee et al.

(10) Patent No.: US 7,528,019 B2
(45) Date of Patent: May 5, 2009

(54) METHOD OF FABRICATING THIN FILM TRANSISTOR OF THIN FILM TRANSISTOR LIQUID CRYSTAL DISPLAY AND METHOD OF FABRICATING LIQUID CRYSTAL DISPLAY

(75) Inventors: Hao-Chieh Lee, Taoyuan (TW); Chi-Hsun Hsu, Taoyuan (TW)

(73) Assignee: AU Optronics Corp., Hsinchu (TW)

( * ) Notice: Subject to any disclaimer, the term of this patent is extended or adjusted under 35 U.S.C. 154(b) by 134 days.

(21) Appl. No.: 11/357,812

(22) Filed: Feb. 16, 2006

(65) Prior Publication Data

US 2006/0183645 A1    Aug. 17, 2006

(30) Foreign Application Priority Data

Feb. 16, 2005   (TW) ................... 94104418
Nov. 8, 2005    (TW) ................... 94139059

(51) Int. Cl.
*H01L 21/00* (2006.01)
*H01L 21/84* (2006.01)

(52) U.S. Cl. ................. 438/149; 438/142; 438/622

(58) Field of Classification Search ............. 438/149, 438/151, 158–160, 164, 197, 412, 424, 430, 438/479, 622, 669, 700, 764, 142; 505/210; 257/E21.414, E29.117
See application file for complete search history.

(56) References Cited

U.S. PATENT DOCUMENTS

| | | | | |
|---|---|---|---|---|
| 5,208,476 | A * | 5/1993 | Inoue | 257/408 |
| 5,340,758 | A * | 8/1994 | Wei et al. | 438/158 |
| 5,510,278 | A * | 4/1996 | Nguyen et al. | 438/158 |
| 5,648,663 | A | 7/1997 | Kitahara et al. | 257/59 |
| 6,022,766 | A * | 2/2000 | Chen et al. | 438/152 |
| 6,136,624 | A * | 10/2000 | Kemmochi et al. | 438/30 |
| 6,534,353 | B1 * | 3/2003 | Kuramasu et al. | 438/197 |
| 6,620,654 | B2 * | 9/2003 | Akram | 438/149 |
| 6,856,360 | B1 * | 2/2005 | Higuchi et al. | 349/43 |
| 7,078,277 | B2 * | 7/2006 | Arao et al. | 438/151 |
| 7,109,071 | B2 * | 9/2006 | Ishikawa | 438/149 |
| 2002/0057393 | A1 * | 5/2002 | Park et al. | 349/43 |
| 2004/0023465 | A1 * | 2/2004 | Gonzalez | 438/396 |

(Continued)

FOREIGN PATENT DOCUMENTS

JP    03-159174    7/1991

(Continued)

OTHER PUBLICATIONS

Zhang G. Guo-Hai et al., "Key Technologies for Copper Interconnections in ULSI" Microelectronics, Vol. 31, No. 2, Apr. 2001, pp. 164-149.

*Primary Examiner*—Thao X Le
*Assistant Examiner*—Eric W Jones
(74) *Attorney, Agent, or Firm*—J.C. Patents

(57) ABSTRACT

A method of fabricating a thin film transistor of a thin film transistor liquid crystal display is provided. First, a patterned dielectric layer is formed over a substrate. A metallic layer is formed over the substrate to cover the patterned dielectric layer. Thereafter, the metallic layer is planarized until the patterned dielectric layer is exposed. The remained metallic layer serves as a gate. An insulating layer is formed over the patterned dielectric layer and the gate, and then a semiconductor layer is formed over the gate insulating layer above the gate. A source and a drain are formed over the semiconductor layer.

8 Claims, 9 Drawing Sheets

U.S. PATENT DOCUMENTS

| | | | |
|---|---|---|---|
| 2004/0101997 A1* | 5/2004 | Maekawa et al. | 438/151 |
| 2005/0079656 A1* | 4/2005 | Ichijo et al. | 438/149 |
| 2005/0098894 A1* | 5/2005 | Ohtani et al. | 257/758 |
| 2005/0101227 A1* | 5/2005 | Balijepalli et al. | 451/41 |
| 2005/0170643 A1* | 8/2005 | Fujii et al. | 438/637 |
| 2005/0218403 A1* | 10/2005 | Kuo | 257/59 |
| 2007/0063227 A1* | 3/2007 | Tsubata et al. | 257/213 |
| 2007/0093002 A1* | 4/2007 | Maekawa et al. | 438/149 |
| 2007/0102818 A1* | 5/2007 | Sasaki et al. | 257/751 |

FOREIGN PATENT DOCUMENTS

JP   03159174 A * 7/1991

* cited by examiner

METHOD OF FABRICATING THIN FILM TRANSISTOR OF THIN FILM TRANSISTOR LIQUID CRYSTAL DISPLAY AND METHOD OF FABRICATING LIQUID CRYSTAL DISPLAY

CROSS-REFERENCE TO RELATED APPLICATION

This application claims the priority benefit of Taiwan applications Ser. No. 94104418 and 94139059, filed on Feb. 16, 2005, and Nov. 8, 2005. All disclosures of the Taiwan applications are incorporated herein by reference.

BACKGROUND OF THE INVENTION

1. Field of the Invention

The present invention relates to a method of fabricating a thin film transistor of a thin film transistor liquid crystal display (TFT-LCD) and a method of fabricating a liquid crystal display. More particularly, the present invention relates to a method of fabricating a thin film transistor of a thin film transistor liquid crystal display (TFT-LCD) and a method of fabricating the liquid crystal display by damascene process.

2. Description of the Related Art

With the rapid progress in the fabrication of semiconductor devices and man-machine interfacing devices, multimedia technologies are deployed everywhere in our society. In the past, cathode ray tubes (CRT) were one of the most important display devices in the market due to their high display quality and moderate pricing. However, in an environment where a large number of desktop operated terminals/display devices are used, energy consumption is also a very important consideration. Because a CRT wastes a lot of power and has a poor spatial utilization, other types of display devices having higher display quality, greater spatial utilization, lower power consumption and capable of radiation-free operation such as the thin film transistor liquid crystal display (TFT-LCD) gradually take over. In fact, TFT-LCD has become one of the mainstream display devices in the market.

The conventional method of fabricating a thin film transistor includes forming a gate on a substrate and then forming an insulating layer and a semiconductor layer sequentially over the substrate to cover the gate. Thereafter, a source and a drain are formed on the semiconductor layer to form a thin film transistor.

In the conventional method of fabricating the thin film transistor, a photolithographic and etching process is used to pattern metallic layers for producing the gate, the source and the drain. Thus, the metallic layers must have a property that matches with the liquid etchant or gaseous etchant used in the etching operation. Therefore, a metal having an ideal etching property such as aluminum to form the metallic layer is selected in the prior art. However, when this type of material is used, the materials that can be used to form the electrodes of the thin film transistor are limited. In particular, because aluminum has a higher resistance relative to other metals, the increase in electrical resistance as the device miniaturization will directly affect the performance of the thin film transistors.

SUMMARY OF THE INVENTION

Accordingly, at least one objective of the present invention is to provide a method of fabricating a thin film transistor of a thin film transistor liquid crystal display that can increase the choice of material for forming the electrodes of the thin film transistor.

At least a second objective of the present invention is to provide a method of fabricating a thin film transistor of a thin film transistor liquid crystal display that can improve the electrical performance of the thin film transistor.

At least a third objective of the present invention is to provide a method of fabricating a liquid crystal display that can improve the electrical performance of the liquid crystal display.

To achieve these and other advantages and in accordance with the purpose of the invention, as embodied and broadly described herein, the invention provides a method of fabricating a thin film transistor of a thin film transistor liquid crystal display. First, a first patterned dielectric layer is formed over a substrate and then a first metallic layer is formed over the substrate to cover the first patterned dielectric layer. Thereafter, the first metallic layer is planarized until the first patterned dielectric layer is exposed. The remaining first metallic layer serves as a gate. After that, a gate insulating layer is formed over the first patterned dielectric layer and the gate. A semiconductor layer is formed over the gate insulating layer above the gate. Finally, a source and a drain are formed over the semiconductor layer.

According to the preferred embodiment of the present invention, the step of planarizing the metallic layer includes performing a chemical-mechanical polishing operation.

According to the preferred embodiment of the present invention, the material constituting the first metallic layer is selected from the group consisting of copper, tungsten, chromium, aluminum and a combination thereof.

According to the preferred embodiment of the present invention, the method of forming the source and the drain includes forming a second patterned dielectric layer over the gate insulating layer and then forming a second metallic layer over the second patterned dielectric layer. Thereafter, a planarization process is performed to remove a portion of the second metallic layer and a portion of the second patterned dielectric layer so as to form the source and the drain. The planarization process includes a chemical-mechanical polishing operation. The material constituting the second metallic layer is selected from the group consisting of copper, tungsten, chromium, aluminum and a combination thereof. Furthermore, after forming the source and the drain, the second patterned dielectric layer is removed.

According to the preferred embodiment of the present invention, before forming the first patterned dielectric layer over the substrate, further comprises forming a stress-buffering layer over the substrate.

According to the preferred embodiment of the present invention, the stress-buffering layer is selected from the group consisting of a silicon oxide layer, a silicon nitride layer, a silicon oxynitride layer and a combination thereof.

According to the preferred embodiment of the present invention, the semiconductor layer comprises a channel layer and an ohmic contact layer.

The present invention also provides an alternative method of fabricating a thin film transistor of a thin film transistor liquid crystal display. First, a gate is formed over a substrate and then a gate insulating layer is formed over the substrate to cover the gate. Thereafter, a semiconductor layer is formed on the gate insulating layer above the gate. A patterned dielectric layer is formed over the gate insulating layer. After that, a metallic layer is formed over the patterned dielectric layer and then a planarization process is performed to remove a portion of the metallic layer and a portion of the patterned dielectric layer to form a source and a drain.

According to one preferred embodiment of the present invention, the planarization process includes a chemical-mechanical polishing operation.

According to one preferred embodiment of the present invention, the material constituting the metallic layer is selected from the group consisting of copper, tungsten, chromium, aluminum and a combination thereof.

According to the preferred embodiment of the present invention, before forming the gate over the substrate, further comprises forming a stress-buffering layer on the substrate. The stress-buffering layer is selected from the group consisting of a silicon oxide layer, a silicon nitride layer, a silicon oxynitride layer and a combination thereof.

According to the preferred embodiment of the present invention, the semiconductor layer comprises a channel layer and an ohmic contact layer.

The present invention also provides a method of fabricating a liquid crystal display. First, a thin film transistor array layer is formed over a first substrate. A second substrate is provided. Then, a liquid crystal layer is formed between the first substrate and the second substrate. The thin film transistor array layer comprises a plurality of thin film transistors and a plurality of pixel electrodes. Each thin film transistor further comprises a gate, a source and a drain. The method of forming the gate and/or the source and drain includes forming a patterned dielectric layer over the substrate and then forming a metallic layer over the patterned dielectric layer. Thereafter, a planarization process is preformed.

According to the preferred embodiment of the present invention, the planarization process includes a chemical-mechanical polishing operation.

According to the preferred embodiment of the present invention, the material constituting the metallic layer is selected from the group consisting of copper, tungsten, chromium, aluminum and a combination thereof.

According to the preferred embodiment of the present invention, the second substrate further comprises a color-filtering layer disposed thereon.

In the method of fabricating the thin film transistor of a thin film transistor liquid crystal display and the method of fabricating the liquid crystal display according to the present invention, a damascene process replaces the conventional photolithographic and etching process. Hence, the type of materials that can be chosen for forming the metallic layer is increased. Furthermore, when the thin film transistor of the thin film transistor liquid crystal display is formed by a damascene process, a metallic material having a lower electrical resistance can be used. Ultimately, the thin film transistor and the liquid crystal display using such thin film transistor can have a better electrical performance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
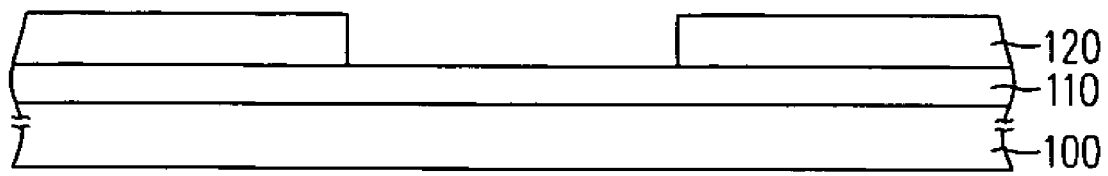
FIGS. 1A through 1D are schematic cross-sectional views showing the steps for fabricating a thin film transistor according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the steps for fabricating a thin film transistor according to one embodiment of the present invention. First, as shown in FIG. 1A, a first patterned dielectric layer 120 is formed over a substrate 100. In the present embodiment, the method of forming the patterned dielectric layer 120 includes depositing a dielectric layer (not shown) and then performing a photolithographic and etching process to pattern the dielectric layer. It should be noted that a stress-buffering layer 110 might be optionally formed on the substrate 100 before forming the first patterned dielectric layer 120. The stress-buffering layer 110 buffers the substrate 100 against stresses encountered during the thin film transistor fabrication process so that cracks and damages in the substrate 100 are minimized. The stress-buffering layer 110 is a silicon oxide layer, a silicon nitride layer, a silicon oxynitride layer and a combination thereof, for example.

Figure 1B:
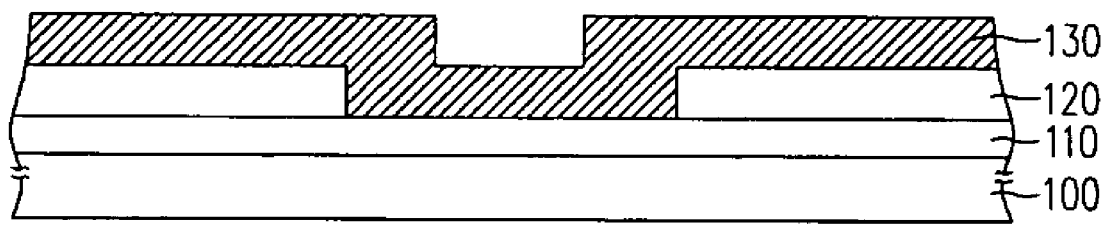

As shown in FIG. 1B, a first metallic layer 130 is formed over the substrate 100 to cover the first patterned dielectric layer 120. In one embodiment, the material constituting the first metallic layer 140 is selected from the group consisting of copper, tungsten, chromium, aluminum and a combination thereof some, for example.

Figure 1C:
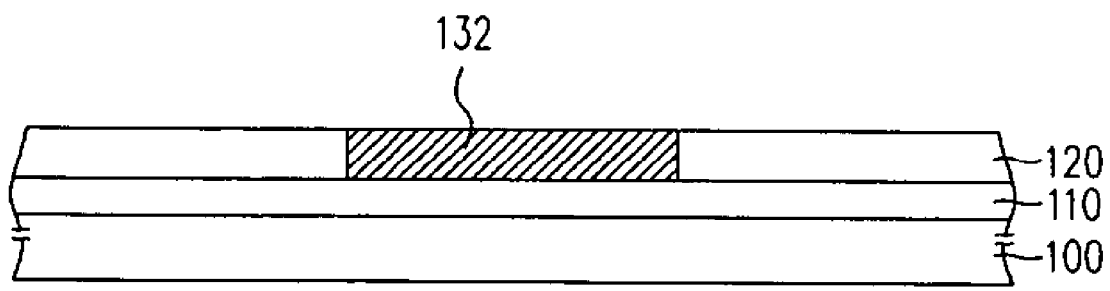

As shown in FIG. 1C, the first metallic layer 130 is planarized until the first patterned dielectric layer 120 is exposed. The step of planarizing the first metallic layer 130 includes performing a chemical-mechanical polishing operation, for example. After the planarization, the remained first metallic layer 130 serves as a gate 132.

Figure 1D:
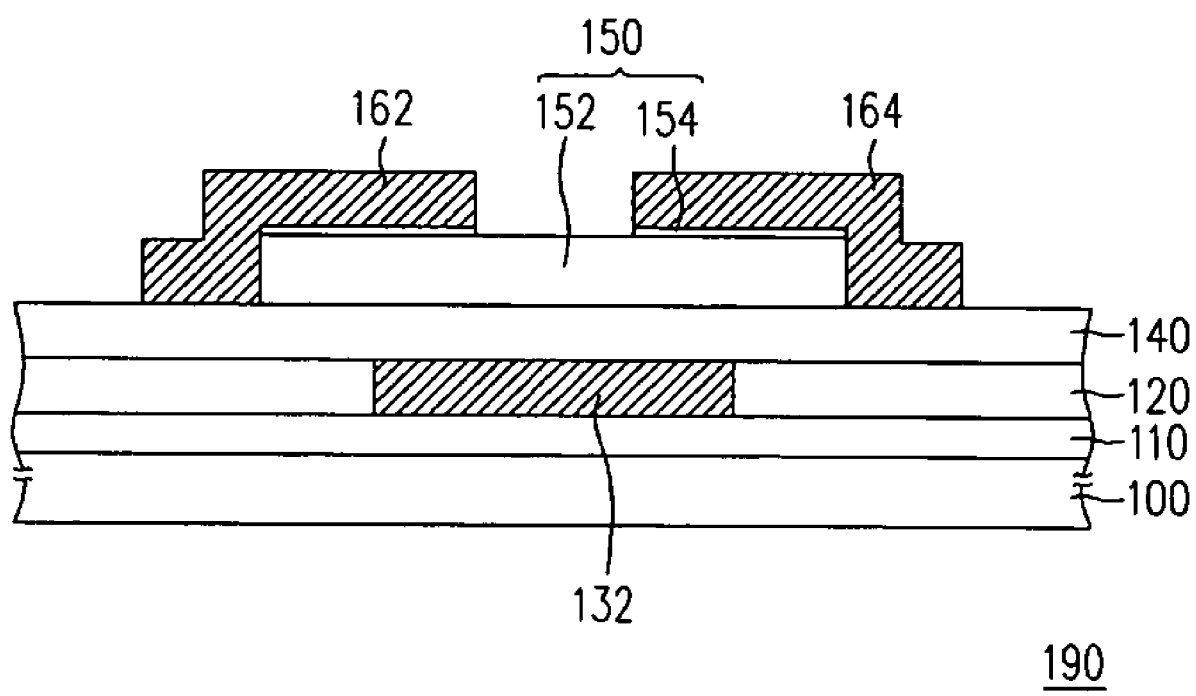

As shown in FIG. 1D, a gate insulating layer 140 is formed over the first patterned dielectric layer 120 and the gate 132. Then, a semiconductor layer 150 is formed over the gate insulating layer 140 above the gate 132. In the present embodiment, the semiconductor layer 150 comprises a channel layer 152 and an ohmic contact layer 154. Furthermore, the gate insulating layer 140 is fabricated using silicon oxide, silicon nitride or silicon oxynitride, for example. The channel layer 152 is fabricated using amorphous silicon and the ohmic contact layer 154 is fabricated using n+ doped amorphous silicon, for example. Thereafter, a source 162 and a drain 164 are formed on the semiconductor layer 150 so that a thin film transistor 190 is formed. In one embodiment, the method of forming the source 162 and the drain 164 includes performing a photolithographic and etching process, for example. After forming the source 162 and the drain 164, an additional passivation layer (not shown) may be formed over the thin film transistor 190.

It should be noted that the aforementioned photolithographic and etching process for forming the source 162 and the drain 164 is only one of the embodiments in the present invention. The process of fabricating the source 162 and the drain 164 is not limited as such. Anyone familiar with the fabrication process may select a more appropriate process that also uses the damascene process according to the actual processing demand. In the following, another embodiment that uses the damascene process for forming the source and the drain is described.

Figure 2A:
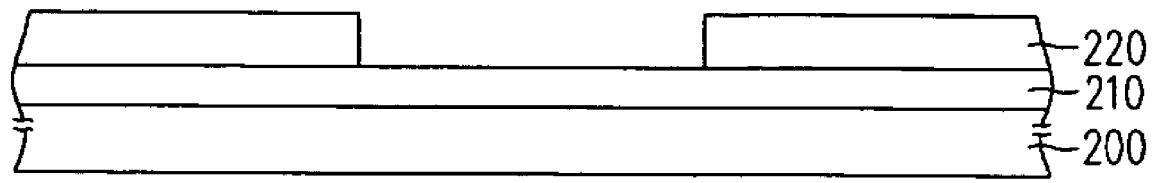
FIGS. 2A through 2F are schematic cross-sectional views showing the steps for fabricating a thin film transistor according to another embodiment of the present invention.
Figure 2B:
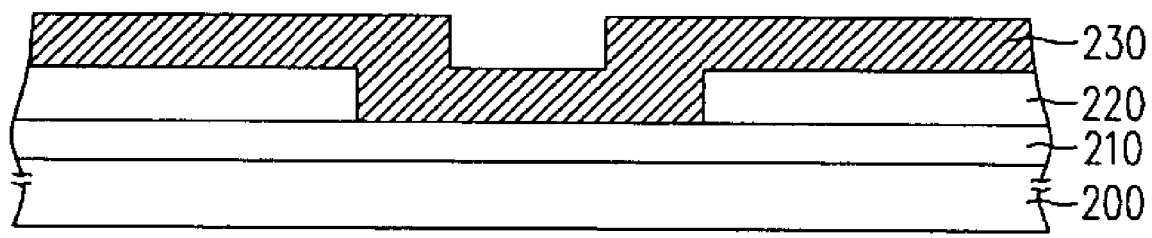
Figure 2C:
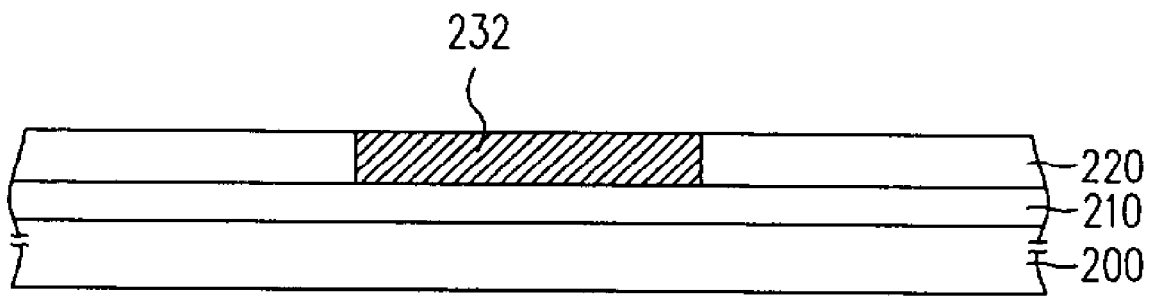

FIGS. 2A through 2F are schematic cross-sectional views showing the steps for fabricating a thin film transistor according to another embodiment of the present invention. In FIGS. 2A~2C, the steps for forming the stress-buffering layer 120, the first patterned dielectric layer 220, the gate 232, the gate insulating layer 240 and the semiconductor layer 250 are described. Since these steps are identical to the steps described in FIGS. 1A~1C, a detailed description is omitted.

Figure 2D:
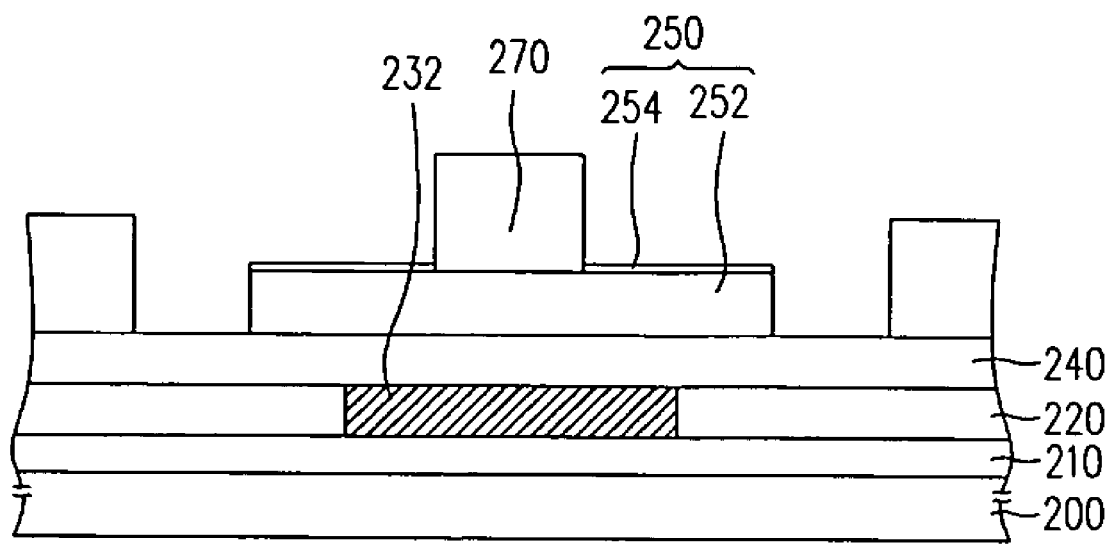

As shown in FIG. 2D, a second patterned dielectric layer 270 is formed over the gate insulating layer 240. The method of forming the second patterned dielectric layer 270 includes, for example, depositing an insulating layer (not shown) and then patterning the insulating layer by performing a photolithographic and etching process. The second patterned dielectric layer 270 is formed over the gate insulating layer 240 but does not cover the entire semiconductor layer 250. A portion of the semiconductor layer 250 is exposed.

Figure 2E:
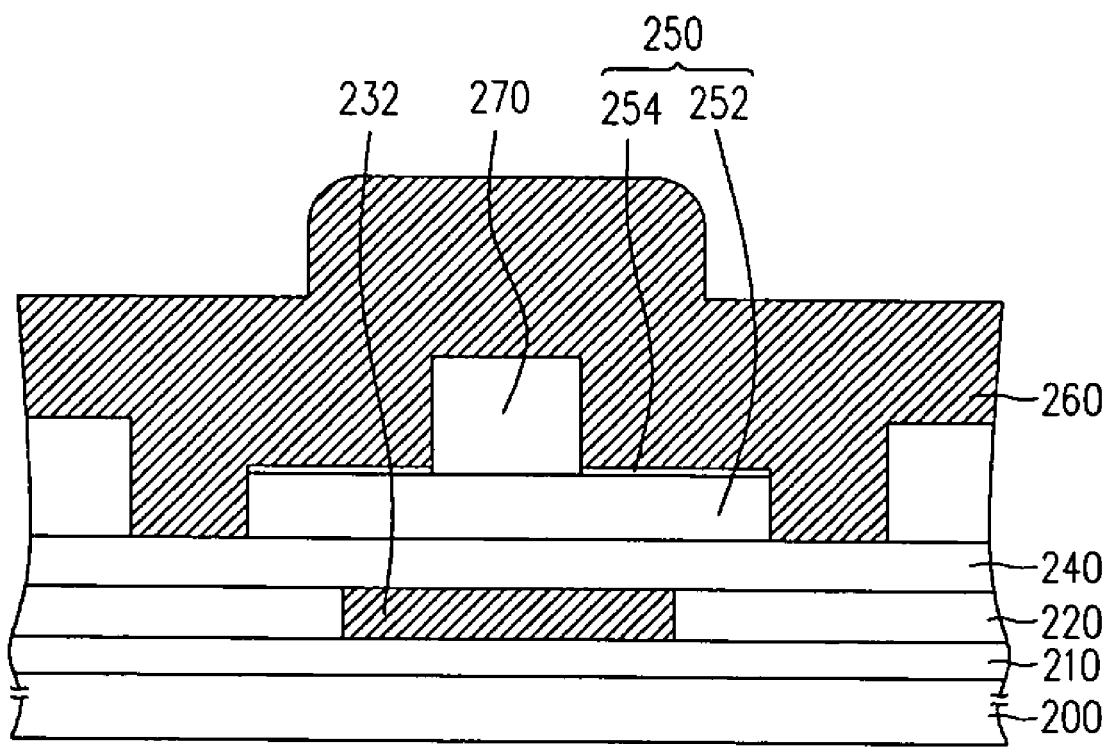

As shown in FIG. 2E, a second metallic layer 260 is formed over the second patterned dielectric layer 270. The second metallic layer 260 can be fabricated using a material identical to the metallic layer used for forming the gate in the aforementioned embodiment. For example, the second metallic layer 260 is selected from the group consisting of copper, tungsten, chromium, aluminum and a combination thereof.

Figure 2F:
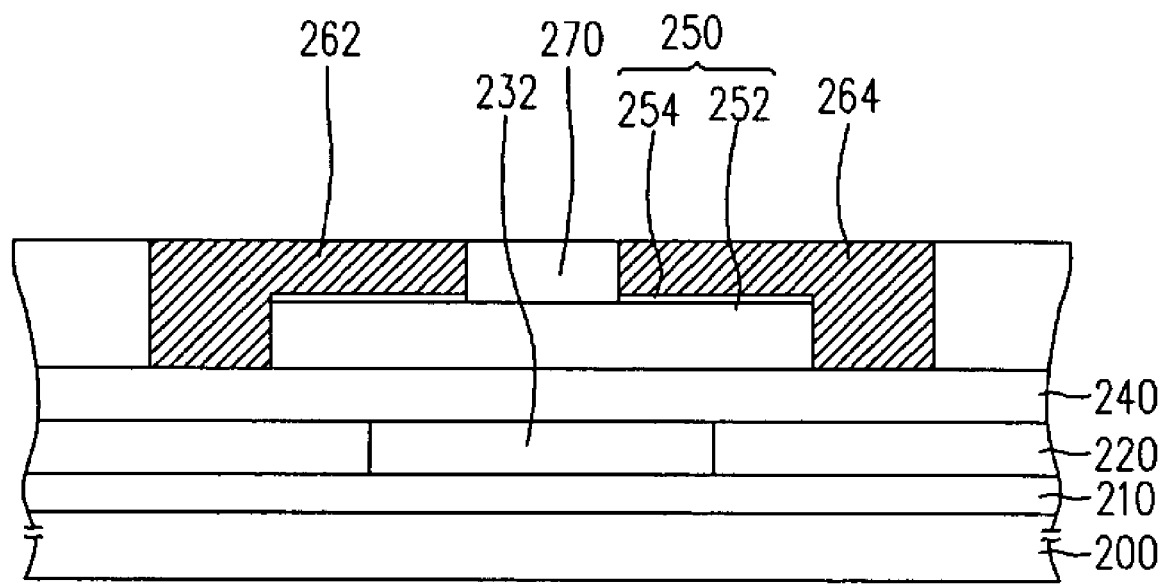

As shown in FIG. 2E and FIG. 2F, a planarization process is performed to the second metallic layer 260. In particular, after the planarization process is carried out to expose the second patterned dielectric layer 270 over the semiconductor layer 250, the planarization process is still performed to remove the second metallic layer 260 and the second patterned dielectric layer 270 over the semiconductor layer 250 until the second patterned dielectric layer 270 at the two sides of the resulted structure of FIG. 2F is exposed. That is, the planarization process completely removes the second metallic layer 260 above the second patterned dielectric layer 270, and the second metallic layer 260 which does not located above the second patterned dielectric layer 270 is remained. The planarization process includes a chemical-mechanical polishing operation, for example. After the planarization process, the remained second metallic layer 260 serves as a source 262 and a drain 264. Hence, a thin film transistor 290 is formed. After forming the source 262 and the drain 264, the second patterned dielectric layer 270 can be optionally removed. Thereafter, a passivation layer (not shown) is formed over the thin film transistor 290.

Figure 3A:
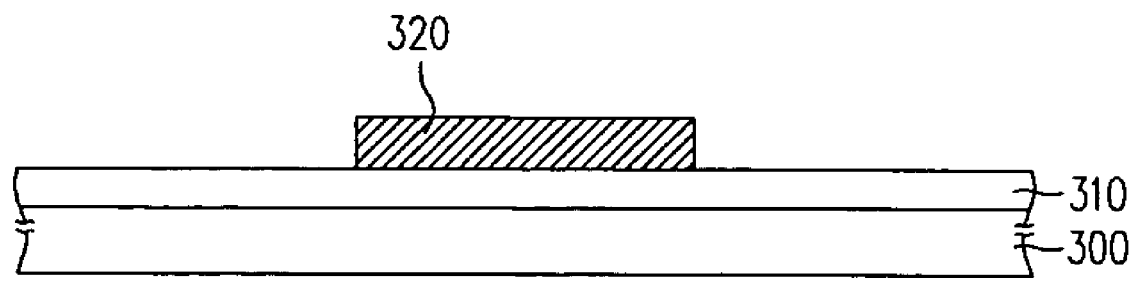
FIGS. 3A through 3F are schematic cross-sectional views showing the steps for fabricating a thin film transistor according to another embodiment of the present invention.

FIGS. 3A through 3F are schematic cross-sectional views showing the steps for fabricating a thin film transistor according to another embodiment of the present invention. First, as shown in FIG. 3A, a gate 320 is formed over a substrate 300. The method of forming the gate 320 includes performing a photolithographic and etching process, for example. It should be noted that an optional stress-buffering layer 110 for buffering the substrate 100 against stress might be formed on the substrate 100 before forming the gate 320. Thus, the substrate 100 is prevented from forming cracks or defects in the process of forming the thin film transistor. This stress-buffering layer 310 can be a silicon oxide layer, a silicon nitride layer, a silicon oxynitride layer and a combination thereof, for example.

Figure 3B:
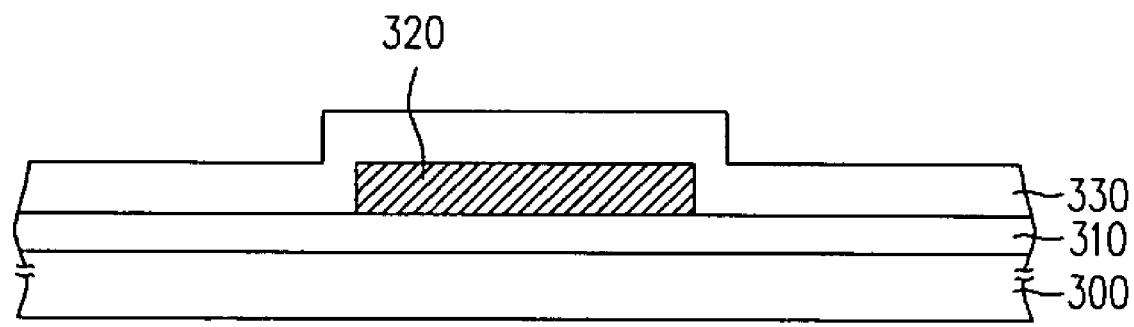

As shown in FIG. 3B, a gate insulating layer 330 is formed over the substrate 300 to cover the gate 320.

Figure 3C:
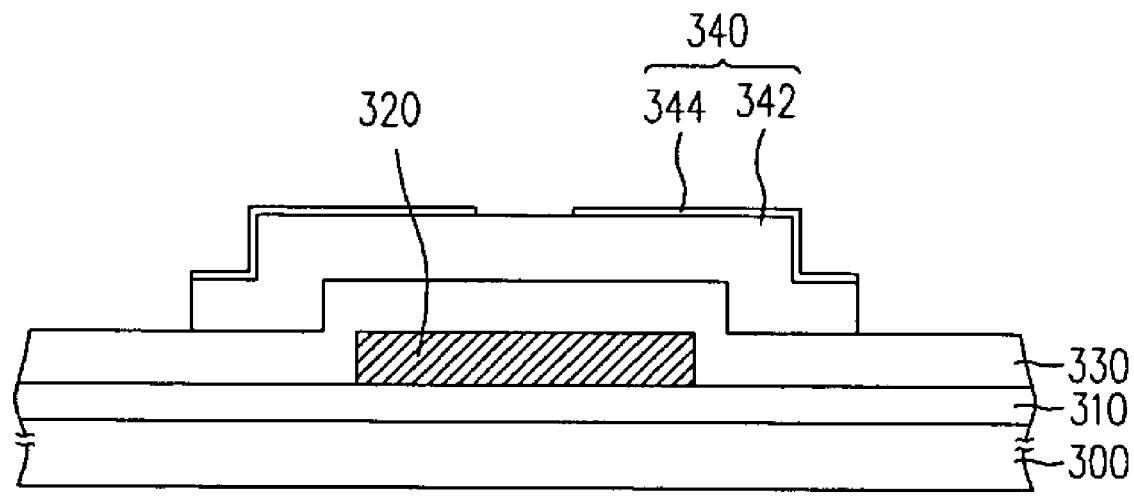

As shown in FIG. 3C, a semiconductor layer 340 is formed over the gate insulating layer 330 above the gate 320. The semiconductor layer 340 comprises a channel layer 342 and an ohmic contact layer 344. In the present embodiment, the gate insulating layer is fabricated using silicon oxide, silicon nitride or silicon oxynitride, for example. The channel layer 342 is fabricated using amorphous silicon and the ohmic contact layer 344 is fabricated using n+ doped amorphous silicon, for example.

Figure 3D:
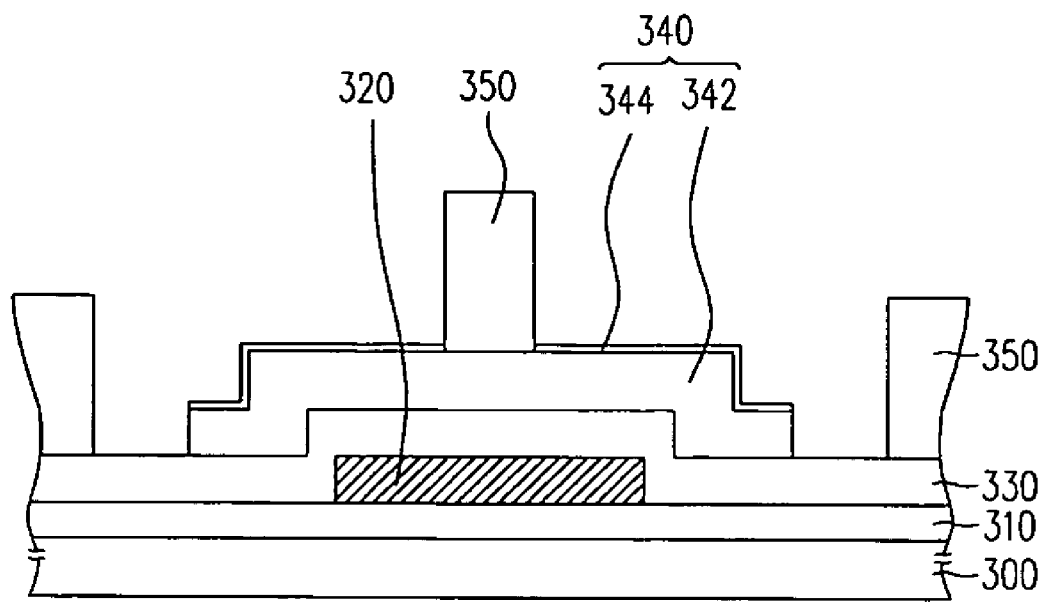

As shown in FIG. 3D, a patterned dielectric layer 350 is formed over the semiconductor layer 340. In one embodiment, the method of forming the patterned dielectric layer 350 includes depositing a dielectric layer (not shown) and then patterning the dielectric layer (not shown) by a photolithographic and etching process to form the patterned dielectric layer 350. The patterned dielectric layer 350 covers only a portion of the semiconductor layer 340. A portion of the semiconductor layer 340 is exposed.

Figure 3E:
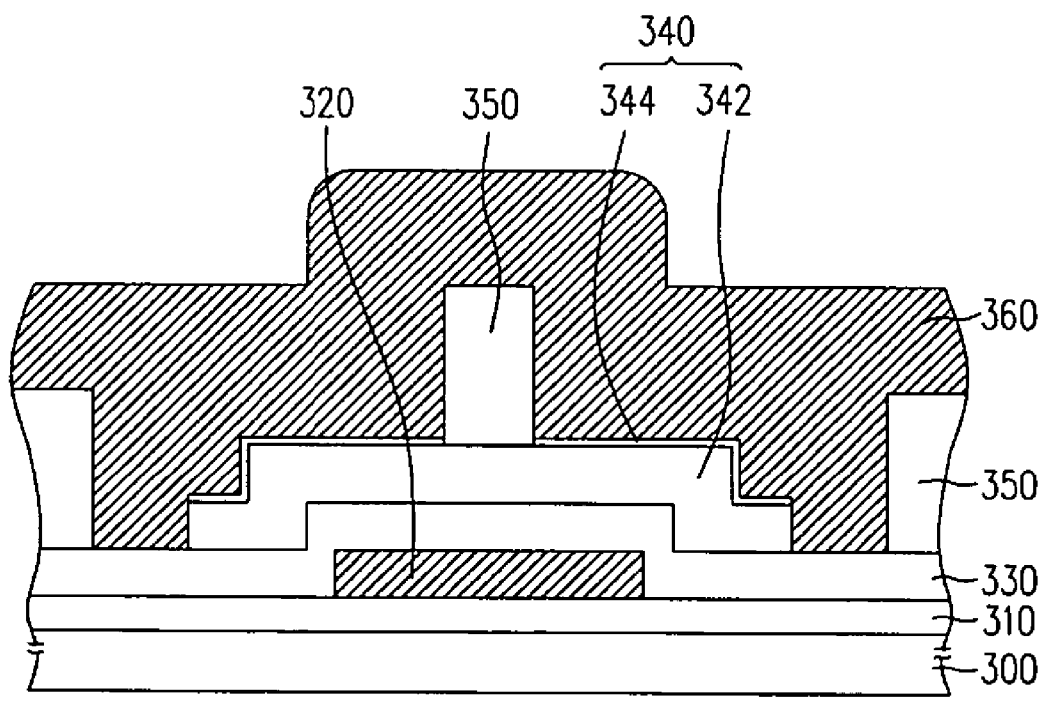

As shown in FIG. 3E, a metallic layer 360 is formed over the patterned dielectric layer 350. The metallic layer 360 is selected from the group consisting of copper, tungsten, chromium, aluminum and a combination thereof, for example.

Figure 3F:
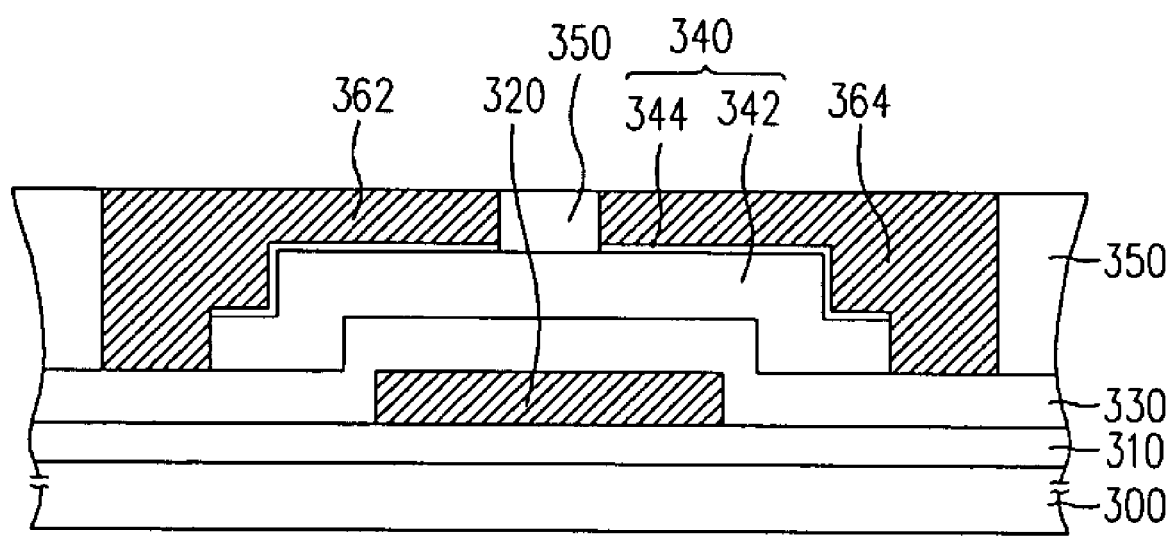

As shown in FIG. 3E and FIG. 3F, a planarization process is performed to the metallic layer 360. In particular, after the planarization process is carried out to expose the patterned dielectric layer 350 over the semiconductor layer 340, the planarization process is still performed to remove the metallic layer 360 and the patterned dielectric layer 350 over the semiconductor layer 340 until the patterned dielectric layer 350 at the two sides of the resulted structure of FIG. 3F is exposed. That is, the planarization process completely removes the metallic layer 360 above the patterned dielectric layer 350, and the metallic layer 360 which does not located above the patterned dielectric layer 350 is remained. The planarization process includes, for example, a chemical-mechanical polishing operation. After the planarization, the remained metallic layer constitutes a source 362 and a drain 364. Thus, a thin film transistor 390 is formed. After forming the source 362 and the drain 364, the patterned dielectric layer 350 is optionally removed. Thereafter, a passivation layer (not shown) is formed over the thin film transistor 390.

Figure 4:
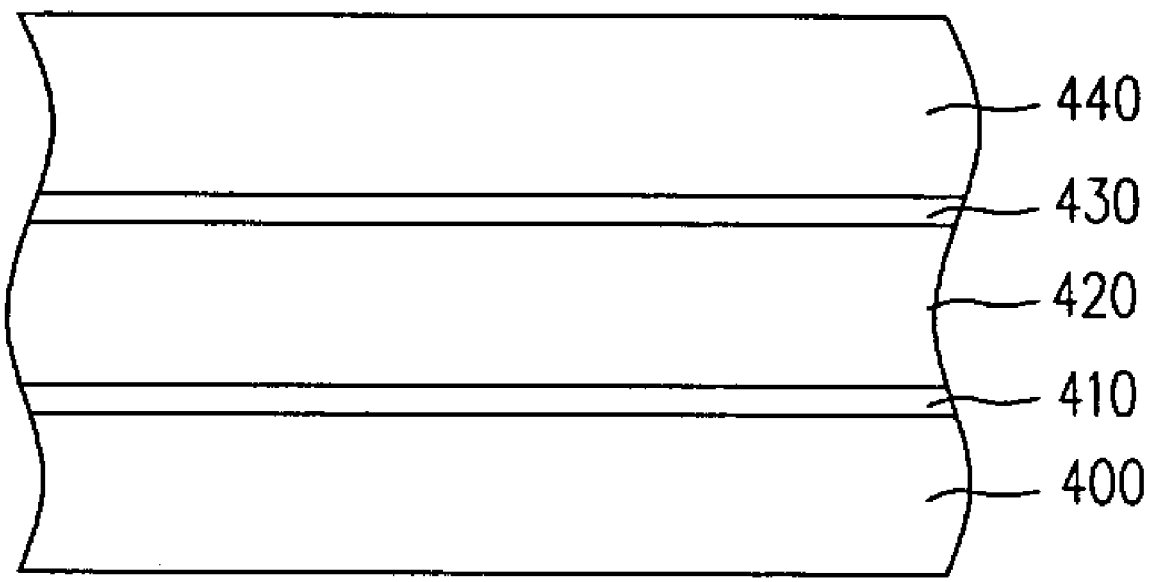
FIG. 4 is a schematic cross-sectional view of a liquid crystal display according to one embodiment of the present invention.

FIG. 4 is a schematic cross-sectional view of a liquid crystal display according to one embodiment of the present invention. The method of forming a liquid crystal display 450 according to the present invention includes forming a thin film transistor array layer 410 over a first substrate 400. The thin film transistor array layer 410 comprises a plurality of thin film transistors (not shown) and a plurality of pixel electrodes (not shown). The thin film transistors in the thin film transistor array layer 410 is formed using the aforementioned damascene process (in FIGS. 1A~1D or FIGS. 2A~2F or FIGS. 3A~3F). After forming the thin film transistors, the pixel electrodes are defined and each pixel electrode is electrically connected to a corresponding thin film transistor.

Thereafter, a second substrate 440 is provided. The second substrate 440 has a color filter layer 430 thereon, for example. Then, a liquid crystal layer 420 is formed between the first substrate 400 and the second substrate 440 to form a thin film transistor liquid crystal display 450. Here, any conventional methods can be used to form the color filter layer 430 on the second substrate 440 and the liquid crystal layer 420 between the two substrates 400 and 440.

In summary, the method of fabricating the thin film transistor of a thin film transistor liquid crystal display according to the present invention includes using a damascene process to form the electrodes of the transistor. Consequently, more choices of materials are available for forming the electrodes of the thin film transistors. Furthermore, if a material having a lower resistance such as copper is used as the electrode material for the thin film transistors, the electrical performance of the thin film transistor and the liquid crystal display using such thin film transistor will improve.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a thin film transistor, comprising:

providing a substrate;

forming a first patterned dielectric layer having at least one first opening over the substrate;

forming a first metallic layer to cover the first patterned dielectric layer and the first opening;

planarizing the first metallic layer until the first patterned dielectric layer is exposed, wherein the remained first metallic layer is formed in the first opening and serves as a gate;

forming a gate insulating layer over the first patterned dielectric layer and the gate;

forming a semiconductor layer over the gate insulating layer above the gate;

forming a second patterned dielectric layer over the gate insulating layer;

forming a second metallic layer over the second patterned dielectric layer having a plurality of second openings;

performing a planarization process to remove a portion of the second metallic layer and a portion of the second patterned dielectric layer so as to form a source and a drain in the second openings; and after forming the source and the drain, removing the second patterned dielectric layer.

2. The method of claim 1, wherein the step of planarizing the first metallic layer includes performing a chemical-mechanical polishing operation.

3. The method of claim 1, wherein the material constituting the first metallic layer is selected from the group consisting of copper, tungsten, chromium, aluminum and a combination thereof.

4. The method of claim 1, wherein the step of planarizing the second metallic layer includes performing a chemical-mechanical polishing operation.

5. The method of claim 1, wherein the material constituting the second metallic layer is selected from the group consisting of copper, tungsten, chromium, aluminum and a combination thereof.

6. The method of claim 1, further comprising forming a stress-buffering layer over the substrate before forming the first patterned dielectric layer over the substrate.

7. The method of claim 6, wherein the material constituting the stress-buffering layer is selected from the group consisting of silicon oxide, silicon nitride, silicon oxynitride and a combination thereof.

8. The method of claim 1, wherein the semiconductor layer comprises a channel layer and an ohmic contact layer.

* * * * *